United States Patent [19]

Drake

[11] Patent Number: 4,796,977

[45] Date of Patent: Jan. 10, 1989

[54] UNITARY LCD DISPLAY HOLDER

[76] Inventor: George M. Drake, 8757 Pierpoint Cove, Germantown, Tenn. 38138

[21] Appl. No.: 26,635

[22] Filed: Mar. 17, 1987

[51] Int. Cl.[4] .................................................. G02F 1/13
[52] U.S. Cl. .................................. 350/331 R; 350/334
[58] Field of Search ...................... 350/331 R, 334; 339/61 C

[56] References Cited

U.S. PATENT DOCUMENTS

| | | | |
|---|---|---|---|
| 3,862,830 | 1/1975 | Stern | 350/334 |
| 3,910,029 | 10/1975 | Yamazaki | 350/334 |
| 4,012,117 | 3/1977 | Lazzery | 350/334 |
| 4,357,061 | 11/1982 | Crosby | 350/334 |
| 4,367,467 | 1/1983 | Emile, Jr. | 350/334 |
| 4,422,728 | 12/1983 | Andreaggi | 350/334 |

*Primary Examiner*—Stanley D. Miller
*Assistant Examiner*—Huy K. Mai

[57] ABSTRACT

A unitary holder of removably mounting and electrically connecting to a visually perceptible display including integral locating and retention means for the display.

15 Claims, 2 Drawing Sheets

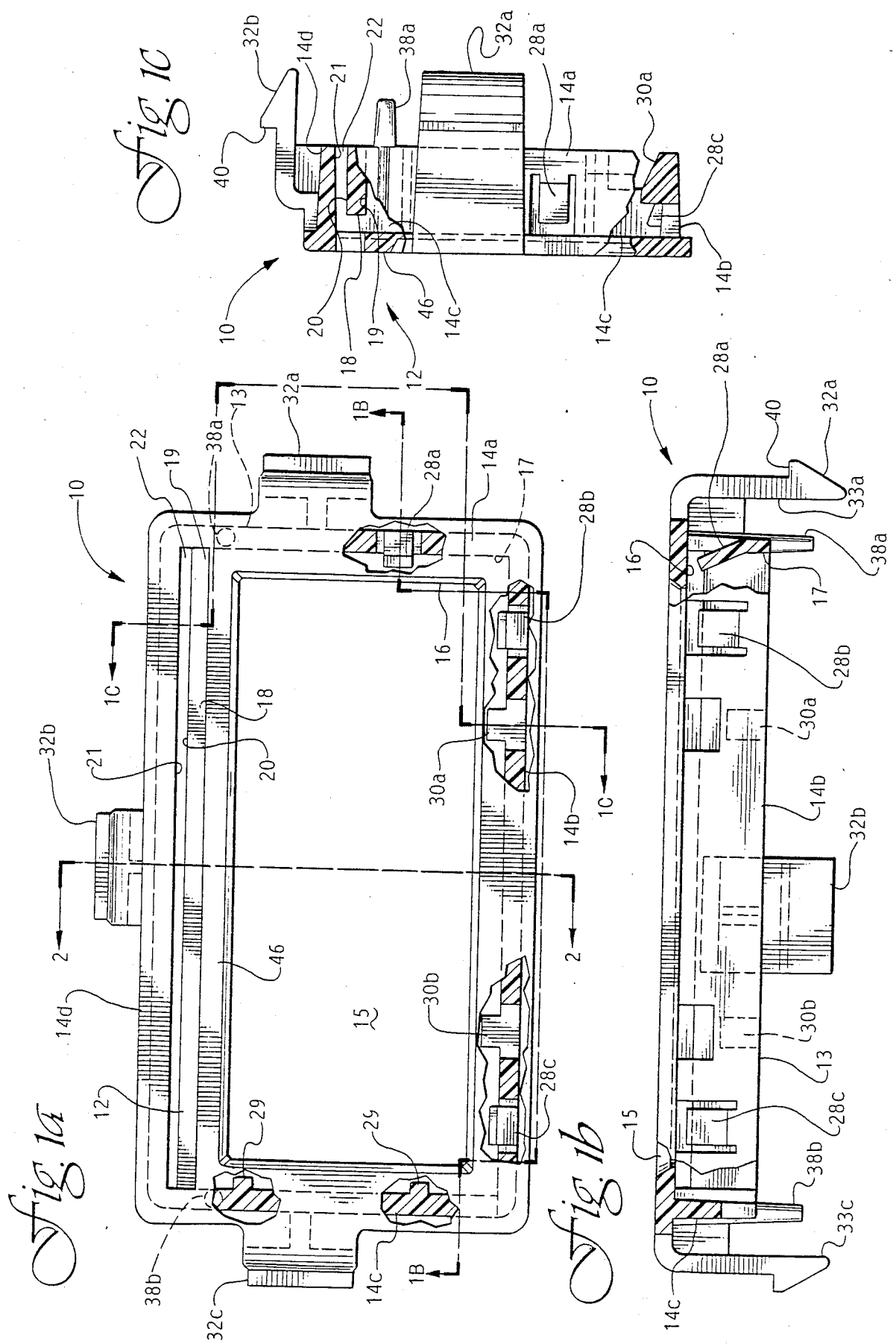

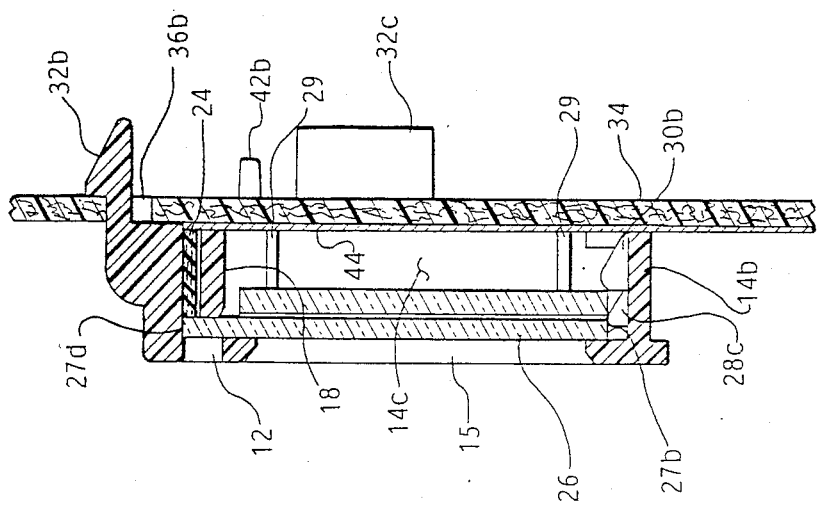
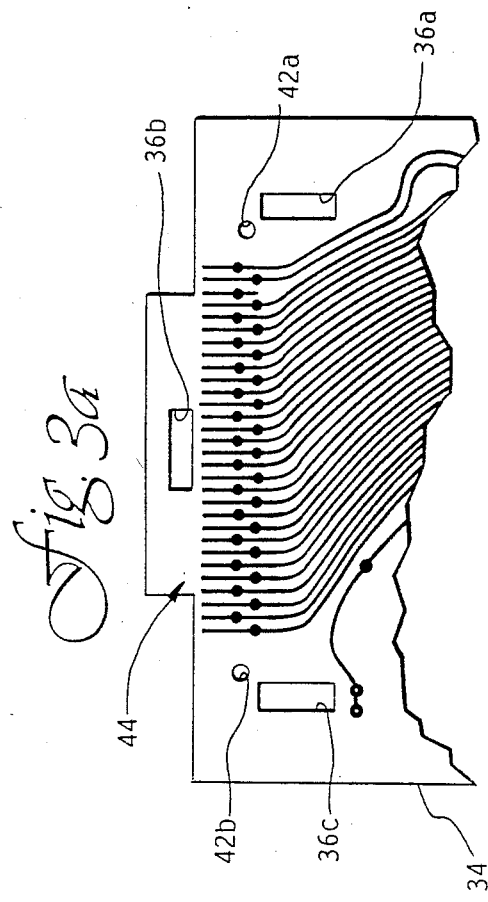
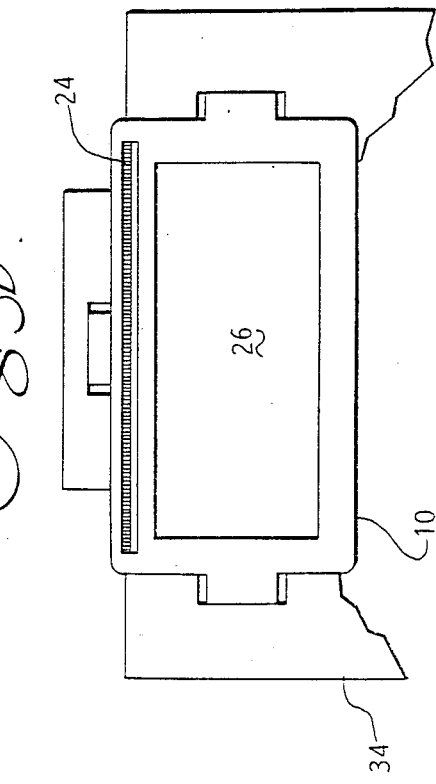

UNITARY LCD DISPLAY HOLDER

BACKGROUND OF THE INVENTION

In the past, a number of separate parts were required to mount a liquid crystal display (LCD). By having a relatively large number of parts, such mounts were more costly and difficult to assemble. In addition, because the LCD is typically in a glass enclosure, making electrical connection to the LCD is typically more difficult than making connection to other types of displays and requires accommodation of special connectors.

SUMMARY OF THE INVENTION

The present invention provides for a one-piece or unitary holder for positively locating and removably mounting a liquid crystal or other similar visually perceptible display to a planar surface. The one-piece holder of the present invention has side walls extending at least partially around the periphery of the holder, an inwardly projecting lip to retain the display from the front, an interior wall spaced apart from a first side wall to define a recess for receiving an edge connector to make electrical connection to the liquid crystal display, and a plurality of resilient inwardly projecting elements integrally formed on the holder in adjacent side wall portions for positively locating the display in the holder. The holder also has an integrally formed projection having a stepped portion to retain the display in the holder from the back, and finally has a plurality of resilient supports having steps integrally formed as a part of the holder extending beyond the exterior wall for removably mounting the holder to a printed circuit board or other planar surface.

BRIEF DESCRIPTION OF THE DRAWINGS

FIG. 1A shows a top or front view with portions cut away to show details of the display locating and retention means of the unitary holder of the present invention.

FIG. 1B shows a side view with corners cut away to show details of the inwardly projecting lip and locating elements of the unitary holder of the present invention.

FIG. 1C shows an end view with corners cut away and showing partial section views along lines 1C—1C' of FIG. 1A to illustrate the connector recess and display retention means of the unitary holder of the present invention.

FIG. 2 shows a cross-section view along line 2—2' of the assembly of the holder of FIG. 1A, a liquid crystal display and an edge connector mounted to a printed circuit board.

FIG. 3A shows a portion of a top or plan view of a printed circuit board suitable for receiving the display holder of the present invention.

FIG. 3B shows a simplified top view of FIG. 2 illustrating the display holder of the present invention mounted on the printed circuit board of FIG. 3A.

DETAILED DESCRIPTION

Referring now more particularly to FIGS. 1A-C, a display holder or frame 10 is molded in one piece, preferably of a plastic material. Frame 10 has side wall portions 14a–d which together make up an exterior wall 13. Side wall portions 14a,b oppose side wall portions 14c,d respectively. An inwardly projecting lip 16 is attached to at least one side wall portion. Lip 16 preferably extends around the entire periphery of holder 10 to form a closed border for a viewing aperture 15 but may alternatively extend around only a portion of aperture 15. Aperture 15 permits viewing of a visually perceptible display 26 when it is received in holder 10. Display 26 is preferably a planar liquid crystal display or LCD. A second aperture 12 may be formed in holder 10, to facilitate the molding of an interior wall 18 which extends parallel to side wall portion 14d and is integrally molded to side wall portions 14a,c. Interior wall 18 has a first surface 20 which is preferably generally parallel to an interior surface 21 of side wall portion 14d, forming a recess 22. Recess 22 is provided to accommodate an edge connector means 24. Edge connector 24 is preferably a resilient structure of alternating layers of conductive and non-conductive material. One such connector commercially available is identified as a Zebra connector, available from Tecknit, a TWP Company, 135 Briant Avenue, Cranford, N.J. 07016.

Referring now more particularly also to FIGS. 2 and 3A, an assembly of the liquid crystal display 26 and the edge connector 24 and holder 10 is shown installed in a printed circuit board or other planar surfaces 34. Resilient electrical connector 24 is received in recess 22 to make electrical connection between a plurality of conductors 44 on printed circuit board 34 and conductors (not shown) on liquid crystal display 26.

Lip 16 retains LCD 26 from the front. LCD 26 is retained in holder 10 from the back by: (i) a plurality of inwardly projecting steps 30a,b integrally formed in side wall portion 14b, and (ii) an end surface 19 of wall 18. LCD 26 is installed in holder 10 by inserting one edge 27d of LCD 26 between end surface 19 and the opposing portion 46 of lip 16 and then drawing an opposite edge 27b of LCD 26 past steps 30a,b.

Frame 10 further has inwardly projecting elements 28a–c in adjacent side wall portions 14a,b. Element 28a resiliently urges LCD 26 against lands 29 and elements 28b,c urges LCD 26 against interior surface 21. Element 28a in cooperation with lands 29 provides accurate registration of LCD 26 in holder 10. Other features of holder 10 as will be described further cooperate to provide registration of holder 10 on printed circuit board 34 so that proper electrical connection is made between LCD 26 and conductors 44.

A plurality of stepped supports 32a–c are also integrally formed with holder 10, with each having a stepped portion 40. Supports 32 are adapted to be received in mating apertures 36a–c in planar surface 34. As may be seen most clearly in FIG. 2, stepped portion 40 engages circuit board 34 to provide for positive retention of holder 10. Nonetheless, holder 10 may be removed by resiliently urging supports 32a,c towards each other and pivoting holder 10 about support 32b until holder 10 is clear of printed circuit board 34. Alternatively one or more of the apertures in the circuit board 34 may be omitted and other suitable contours provided, as, for example, sizing the end of the circuit board or other mounting surface to match the distance between surfaces 33a,c with stepped portion 40 of stepped supports 32a,c turned inward towards each other to retain holder 10 to surface 34. Posts 38a,b are preferably also integrally formed in holder 10 for positively locating holder 10 with respect to circuit board 34 to provide for registration of LCD 26 with conductors 44. Posts 38a,b are received in corresponding apertures 42a,b in circuit board 34 when holder 10 is installed.

The invention is not to be taken as limited to all of the details thereof as modifications and variations may be made without departing from the spirit or scope of the invention. For example, if it is not desired to have holder 10 removable from its mounting surface 34, supports 32a–c may be formed initially without stepped portion 40 and deformed or heat staked to surface 34 upon installation. Alternatively supports 32a–c may be eliminated and posts 38a,b may be or otherwise secured to surface 34 if desired.

What is claimed is:

1. A one-piece display holder for positively locating and removably mounting a visually perceptible display comprising:
    (a) an exterior wall having a plurality of opposed side wall portions at the periphery of said one-piece display holder with at least one of said side wall portions having an inwardly projecting lip forming a closed border for retaining the display within said one-piece display holder;
    (b) an interior wall extending parallel to a first one of said side wall portions and having a first surface spaced apart from the interior surface of said first side wall portion and defining a recess for receiving an edge-connector means for making electrical connection to a visually perceptible display received in said one-piece display holder;
    (c) at least one resilient inwardly projecting element integrally formed in one side wall portion of said one-piece display holder for resiliently urging a visually perceptible display received in said holder against a side wall portion opposed to said side wall portion having said resilient inwardly projecting element formed therein; and
    (d) support means for removably mounting said one-piece display holder to a planar surface.

2. The holder of claim 1 wherein said support means further comprises at least one stepped support integrally formed in said holder and extending from said exterior wall for mounting said holder to said planar surface having mating contours adapted to receive the stepped portion of said supports for retaining said holder to said planar surface.

3. The holder of claim 1 further comprising at least one inwardly projecting step integrally formed in said holder and located at a side wall portion other than said first one of said side wall portions for retaining the visually perceptible display received in said holder; and 4. The holder of claim 1 wherein said lip further comprises a closed border defining a viewing aperture in said holder.

5. The holder of claim 1 wherein said inwardly projecting step is located on a side wall portion opposite said interior wall.

6. The holder of claim 1 further comprising a pair of stepped supports located on opposing side wall portions of said exterior side wall.

7. The holder of claim 1 further comprising post means integrally formed as a part and projecting from said holder and adapted to be received in mating aperture means in said circuit board for positively positioning said holder with respect to said planar surface.

8. The holder of claim 1 further comprising a plurality of lands integrally formed in the side wall portion opposite said resilient inwardly projecting element.

9. The holder of claim 1 further comprising a second resilient inwardly projecting element on a side wall portion adjacent said side wall portion having said resilient inwardly projecting element formed therein.

10. The holder of claim 1 in combination with a visually perceptible display received therein.

11. The holder and display of claim 10 wherein said visually perceptible display is a liquid crystal display.

12. The holder and display of claim 10 in combination with a planar mounting surface.

13. The holder and display and planar mounting surface of claim 12 wherein said planar surface further comprises a printed circuit board.

14. The holder and display and planar mounting surface of claim 13 in combination with a resilient electrical connector received in said recess for making connection between said printed circuit board and said visually perceptible display.

15. The combination of a planar liquid crystal display, a resilient electrical connector formed of a plurality of spaced apart conductive segments, and a display holder comprising:
    (i) a unitary holder having side wall portions extending completely around the periphery of said holder with at least one of said side wall portions having an inwardly projecting lip at a first surface thereof;
    (ii) an interior wall extending parallel to a first one side wall portion and having a first surface spaced apart from and generally parallel to an interior surface of said first one of said side wall portions defining a recess receiving said resilient electrical connector for making electrical connection to said planar liquid crystal display received in said holder;
    (iii) a plurality of resilient inwardly projecting elements integrally formed as a part of said holder in adjacent side wall portions for positively locating said liquid crystal display in said holder; and
    (iv) at least one inwardly projecting step integrally formed as a part of said holder and located on a side wall portion other than said first one of said side wall portions for retaining one edge of said liquid crystal display in said holder such that said planar liquid crystal display is located in said holder generally perpendicularly to said resilient electrical connector.

* * * * *